US012628322B2

(12) United States Patent
Sun

(10) Patent No.: US 12,628,322 B2
(45) Date of Patent: May 12, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Shaobo Sun, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1017 days.

(21) Appl. No.: 17/755,284

(22) PCT Filed: Apr. 13, 2022

(86) PCT No.: PCT/CN2022/086647
§ 371 (c)(1),
(2) Date: Apr. 26, 2022

(87) PCT Pub. No.: WO2023/173522
PCT Pub. Date: Sep. 21, 2023

(65) Prior Publication Data
US 2024/0172404 A1      May 23, 2024

(30) Foreign Application Priority Data

Mar. 17, 2022    (CN) .......................... 202210263597.3

(51) Int. Cl.
*H05K 9/00* (2006.01)
*G02F 1/1333* (2006.01)
*G09F 9/30* (2006.01)

(52) U.S. Cl.
CPC ......... *H05K 9/0054* (2013.01); *G02F 1/1333* (2013.01); *G09F 9/301* (2013.01)

(58) Field of Classification Search
None
See application file for complete search history.

(56) References Cited

U.S. PATENT DOCUMENTS

2017/0179423 A1    6/2017  Kwon et al.
2020/0310577 A1*  10/2020  Jeon ...................... H10K 59/12
2021/0175462 A1    6/2021  Shin et al.

FOREIGN PATENT DOCUMENTS

CN        106019449 A      10/2016
CN        106711183 A       5/2017
CN        109256414 A       1/2019
CN        109979327 A       7/2019
(Continued)

*Primary Examiner* — Eli D. Strah

(57) ABSTRACT

Embodiments of the present disclosure are directed to a display panel and a display device. The display panel includes a display body, a first back plate, a second back plate and a buffer support structure. The buffer support structure is connected to the first back plate and the second back plate. At least one of the first back plate and the second back plate has a groove placed at one side facing the buffer support structure and the buffer support structure is partially placed in the groove. The distance between the first back plate and the second back plate is reduced and thus the bending radius of the bending part is reduced.

17 Claims, 2 Drawing Sheets

(56)             References Cited

FOREIGN PATENT DOCUMENTS

| | | | | |
|----|-----------|---|---------|---------------------|
| CN | 110212089 | A | 9/2019  | |
| CN | 111951683 | A | 11/2020 | |
| CN | 112086573 | A | 12/2020 | |
| CN | 112289185 | A * | 1/2021 | ............... G09F 9/30 |
| CN | 112967606 | A | 6/2021  | |
| CN | 113066361 | A * | 7/2021 | ......... B32B 37/1292 |
| CN | 113823196 | A | 12/2021 | |
| CN | 113888977 | A | 1/2022  | |

* cited by examiner

100

180
170
160
110

141
143  140
142

135
151
150    1521
       1522
152    1523
120  190  131(130)

100

180
170
160
110

141
143  140
142

134
132
151
150    1521
       1522
152    1523
120  190  131  133

10

300  100  200

DISPLAY PANEL AND DISPLAY DEVICE

FIELD OF THE DISCLOSURE

The present disclosure relates to a display technology, and more particularly, to a display panel and a display device.

BACKGROUND

As the development progress of the display fields, a display tends to be thinner and have narrower side frame. A flexible display panel could reduce the size of the lower side frame by bending the display panel body. For better balancing the applied force of the bending wires, there is a higher demand for the bending technique of the display panel. However, the bending radius of the bending part of the conventional display panel is too long such that the minimum size of the side frame of the display panel is limited and thus the narrow side frame demand cannot be met.

SUMMARY

Technical Problem

One objective of an embodiment of the present disclosure is to provide a display panel and a display device, to solve the above-mentioned issue of the long bending radius.

Technical Solution

According to an embodiment of the present disclosure, a display panel is disclosed. The display panel comprises: a display body, a first back plate, a second back plate and a buffer support structure. The display body comprises: a display part; a bonding part, placed oppositely to the display part; and a bending part, connected between the display part and the bonding part. The first back plate is placed at one side of the display part facing the bonding part. The second back plate is placed at one side of the bonding part facing the display part. The buffer support structure is connected to the first back plate and the second back plate. At least one of the first back plate and the second back plate has a groove placed at one side facing the buffer support structure and the buffer support structure is partially placed in the groove.

Optionally, the display part comprises a switch control layer and a light emitting layer electrically connected to the switch control layer.

Optionally, the display panel further comprises a circuit board electrically connected to the switch control layer. The bonding part is connected to the circuit board at a side of the display part away from the display part.

Optionally, the buffer support structure comprises a buffer layer and a supporting layer orderly placed from the first back plate toward the second back plate.

Optionally, a first sub-groove is placed at one side of the second back plate facing the supporting layer, and at least a part of the supporting layer is placed in the first sub-groove.

Optionally, the supporting layer comprises a first glue layer, a wave absorption layer and a second glue layer orderly placed from the first back plate toward the second back plate. The second glue layer is placed in the first sub-groove. Optionally, the second glue layer and the wave absorption layer are placed in the first sub-groove.

Optionally, the first glue layer is adhered to the buffer layer, and the second glue layer is adhered to the second back plate.

Optionally, the supporting layer is wholly placed in the first sub-groove.

Optionally, a second sub-groove is placed at one side of the first back plate facing the buffer layer, the second groove and the first groove are oppositely placed, and the buffer layer is partially placed in the second sub-groove.

Optionally, an orthogonal projection of the second sub-groove on the buffer layer covers an orthogonal projection of the first sub-groove on the buffer layer.

Optionally, the buffer layer covers the supporting layer.

Optionally, the buffer layer is wholly placed in the second sub-groove.

Optionally, the first sub-groove extends along a direction of the bending part and passes through a side surface of the second back plate facing away the bending part. The buffer layer is partially placed in the first sub-groove.

Optionally, the supporting layer and a sidewall of the first sub-groove have a first gap in-between. The buffer layer and a sidewall of the second sub-groove have a second gap in-between.

Optionally, the second gap between buffer layer and the sidewall of the second sub-groove is smaller than the first gap between the supporting layer and the sidewall of the first sub-groove.

Optionally, the buffer layer is made of a conductive foam.

Optionally, a bending diameter of the bending part of the display panel body is smaller than a sum of a thickness of the first back plate, a thickness of the second back plate and a thickness of the buffer support structure and is greater than a sum of the thickness of the first back plate and the thickness of the second back plate.

Optionally, the display panel further includes a polarizer, an optical adhesive layer, and a cover plate. The polarizer is placed at one side of the display part of the display panel part facing away the first back plate. The optical adhesive layer is placed above the polarizer. The cover plate is placed above the optical adhesive layer.

According to another embodiment of the present disclosure, a display device is disclosed. The display device comprises the above-mentioned display panel.

Optionally, the display device further includes a housing, connecting the display panel, and a controller, disposed within the housing and electrically connected to the display panel.

Advantageous Effect

According to an embodiment of the present disclosure, a display panel is disclosed. The display panel comprises a display body, a first back plate, a second back plate and a buffer support structure. The display body comprises: a display part; a bonding part, placed oppositely to the display part; and a bending part, connected between the display part and the bonding part. The first back plate is placed at one side of the display part facing the bonding part. The second back plate is placed at one side of the bonding part facing the display part. The buffer support structure is connected to the first back plate and the second back plate. At least one of the first back plate and the second back plate has a groove placed at one side facing the buffer support structure and the buffer support structure is partially placed in the groove. The display panel has a groove on at least one of the first back plate and the second plate. Furthermore, the buffer support structure is partially placed in the groove such that the distance between the first back plate and the second back plate is reduced and thus the bending radius of the bending part is reduced. This efficiently reduces the size of the side frame and improves the display effect of the display panel.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF REFERENCE SIGNS

Figure 1:
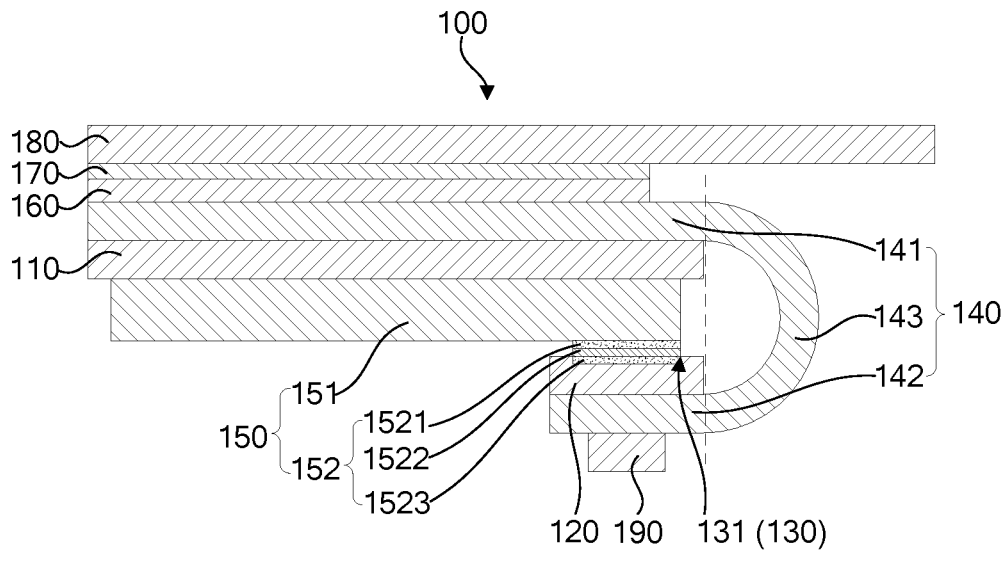
FIG. 1 is a diagram of a display panel according to an embodiment of the present disclosure.

| Label | Name | Label | Name |
|---|---|---|---|
| 10 | display device | 143 | bending part |
| 100 | display panel | 150 | buffer support structure |
| 110 | first back plate | 151 | buffer layer |
| 120 | second back plate | 152 | supporting layer |
| 130 | groove | 1521 | first glue layer |
| 131 | first sub-groove | 1522 | wave absorption layer |
| 132 | second sub-groove | 1523 | second glue layer |
| 133 | first gap | 160 | polarizer |
| 134 | second gap | 170 | optical adhesive layer |
| 135 | opening | 180 | cover plate |
| 140 | display body | 190 | circuit board |
| 141 | display part | 200 | control circuit |
| 142 | bonding part | 300 | housing |

DETAILED DESCRIPTION

The technical solutions in the embodiments of the present disclosure will be clearly and completely described in the following with reference to the accompanying drawings. It is obvious that the described embodiments are merely a part of the embodiments of the present disclosure, and not all of the embodiments. All other embodiments obtained by the ordinary person skilled in the art based on the embodiments of the present disclosure without creative efforts shall fall within the protection scope of the present disclosure. It should be noted that all directional indications, such as upper, lower, left, right, in the embodiments of the present disclosure are only used to explain the relative positional relationship, motion, and the like between the components in a certain posture as shown in the drawings. If the certain posture changes, the directional indication also changes accordingly.

The present disclosure provides a display panel and a display device described in detail below. It should be noted that the description order of the following embodiments is not intended to limit the preferred order of the embodiments.

An embodiment of the present disclosure is directed to a display panel. Please refer to FIG. 1. As shown in FIG. 1, the display panel 100 comprises a display body 140. The display body 140 comprises a display part 141, a bonding part 142 and a bending part 143. The bending part 143 is connected between the display part 141 and the bonding part 142 such that the display body 140 has a bending structure.

The display part of the display body 140 is the light output side of the display body 140. The display part 141 comprises stacked a switch control layer and a light emitting layer. The light emitting layer is electrically connected to the switch control layer. Through the structure design of the switch control layer and the light emitting layer, the display method and the display effect of the display part 141 could be controlled.

A circuit board 190 is connected to one side of the bonding part 142 of the display body 140 facing away the display part 141. The bending part 143 is used to electrically connect the circuit board 190 of the bonding part 142 to the switch control layer of the display part 141 such that the wire structure of the display part 141 of the display body 140 is connected to the bonding part 142 of the display body 140. In this way, while the size of the side frame of the display body 140 is reduced, the display method/effect of the display body 140 is also controlled.

The display panel 100 further comprises a buffer support structure 150. The buffer support structure 140 is connected between the first back plate 110 and the second back plate 120 for supporting the first back plate 11 and the second back plate 120. Furthermore, the buffer support structure 150 could also block the electromagnetic interferences between the display part 141 and the bonding part 142 of the display body and thus ensures the normal display effect of the display panel 100. Because the buffer supporting structure 150 has a certain compressibility, when a force is applied to the display body 140 during the manufacturing or usage process, the buffer support structure 150 could be a buffer for the force through compression so as to protect the display body 140.

Optionally, a groove 130 is placed in one side facing the buffer support structure 150 of at least one of the first back plate 110 and the second back plate 120. That is, the groove 130 could be placed in one side of the first back plate 110 facing the buffer support structure 150, or the groove 130 could be placed in one side of the second back plate 120 facing the buffer support structure 150. The buffer support structure 150 is partially placed in the groove 130 such that the distance between the first back plate 110 and the second back plate 120 is shorter than the thickness of the buffer support structure 150. This reduces the distance between the first back plate 110 and the second back plate 120 and thus could reduce the bending radius of the bending part 143 of the display body 140. In this way, the size of the side frame of the display body 140 could be reduced and the display effect of the display panel 100 could be raised.

By including the groove 130 in one side facing the buffer support structure 150 of at least one of the first back plate 110 and the second back plate 120, the buffer support structure 150 could be partially placed in the groove 130. In this way, the distance between the first back plate 110 and the second back plate 120 could be reduced while the buffer support structure 150 remains unchanged. This could prevent from reducing the thickness (compressible distance) of the buffer support structure 150 to influence the buffer effect of the buffer support structure 150 for the applied force. Furthermore, if the thickness (compressible distance) of the buffer support structure 150 is directly reduced, the structure strength of the buffer support structure 150 could be reduced as well such that the structural stability between the first back plate 110 and the second back plate 120 is affected.

In this embodiment, the groove 130 is placed in one side facing the buffer support structure 150 of at least one of the first back plate 110 and the second back plate 120 and the buffer support structure 150 is partially placed in the groove 130. Therefore, the distance between the first back plate 110 and the second back plate 120 could be reduced such that the bending radius of the bending part 143 of the display body 140 is also reduced. In this way, the size of the side frame of the display body 140 could be reduced and the display effect of the display panel 100 could be raised.

Optionally, the buffer support structure 150 comprises orderly-placed a buffer layer 151 and a supporting layer 152 from the first back plate 110 toward the second back plate 120. That is, the buffer layer 151 is connected to the side of the first back plate 110 facing the second back plate 120. The supporting layer 152 is connected to the side of the second back plate 120 facing the first back plate 110. The buffer layer 151 is connected to the supporting layer 152 to ensure the mutual stability of the display part 141 and the bonding part 142 of the display body o prevent the bonding part 142 of the display body 140 from rebounding to change the bending radius of the bending part 143. This could ensure the entire stability of the display panel 100.

The buffer layer 151 is made of a conductive foam, such as a copper foil foam or an aluminum foil foam. The buffer layer 151 has a shield effect to block the electromagnetic interferences generated by the circuit board 190 on the bonding part 142 of the display body 140. Furthermore, the buffer layer 151 has a buffering effect to buffer the applied force during the manufacturing or usage process of the display body such that the display body 140 is protected. In addition, because the buffer layer 151 is a foam structure, the buffer layer 151 has a better heat dissipation effect. Therefore, the display panel 100 could effectively dissipate the heat generated from the operation through the buffer layer 151 to prevent from inner overheat of the display body 140. This could improve the display effect and the lifetime of the display panel body 140.

Optionally, the first sub-groove 131 is placed in one side of the second back plate 120 facing the buffer support structure 150. The buffer support structure 150 is partially placed in the first sub-groove 131. Therefore, the distance between the first back plate 110 and the second back plate 120 could be shorter than the sum of the thicknesses of the supporting layer 152 and the buffer layer 151. That is, the distance between the first back plate 110 and the second back plate 120 is shorter than the thickness of the buffer support structure 150. This makes it easier to reduce the bending radius of the bending part 143 of the display body 140.

The depth of the first sub-groove 131 could be determined according to the thickness of the supporting layer 152, the thickness of the second back plate 120 and the actual design demands such that the depth of the first sub-groove 131 could meet different demands of different bending radius of the bending part 143 of the display body 140. The depth of the first sub-groove 131 could be determined as long as it is shorter than the thickness of the second back plate 120 to ensure the stability of the second back plate 120 and the stability of the entire structure of the bonding part 142 of the display body 140 as well as the circuit board 190 on the bonding part 190.

When the depth of the first sub-groove 131 is shorter than the thickness of the supporting layer 152, the supporting layer 152 is partially placed in the first sub-groove 131. When the depth of the first sub-groove 131 is equal to the thickness of the supporting layer 152, the supporting layer 152 is wholly placed in the first sub-groove 131. When the depth of the first sub-groove 131 is greater than the thickness of the supporting layer 152, the supporting layer 152 is wholly placed in the first sub-groove 131 and the buffer layer 151 could be partially placed in the first sub-groove 131. Here, each of the scenarios of the display panel 100 will be illustrated in details below.

Because the buffer layer 151 is a foam structure that has a comparatively low structure strength, the supporting layer 152 is placed between the first back plate 110 and the second back plate 120 to raise the mutual stability of the first back plate 110 and the second back plate 120. This also raises the stability of the bending part 143 of the display body 140 and avoids the radius of the bending part 143 of the display body 140 changing during the manufacturing or usage process of the display body 140. Therefore, the display stability of the display body is also maintained.

Optionally, the supporting layer 152 comprises orderly placed a first glue layer 1521, a wave absorption layer 1522 and a second glue layer 1523 orderly placed from the first back plate 110 toward the second back plate 120. Here, the wave absorption layer 1522 is used to block the electromagnetic interferences generated by the circuit structures placed on the second back plate 120 upon the display part 141 of the display body 140 such that the display stability of the display body is ensured. The first glue layer 1531 is used to adhere the buffer layer 151 such that the supporting layer 152 and the buffer layer 151 could form a whole (the buffer support-ing layer 152). The second glue layer is used to adhere the second back plate 120 to connect the buffer support layer 152 to the second back plate 120 such that the mutual stability of the first back plate 110 and the second back plate 120 could be ensured.

In some embodiments, the second glue layer 1523 is placed in the first sub-groove 131. That is, the connection structure between the supporting layer 152 and the second back plate 120 is placed in the first sub-groove 131 such that the distance between the first back plate 110 and the second back plate 120 is equal to the sum of the thicknesses of the buffer layer 151, the first glue layer 1521 and the wave absorption layer 1522. In this way, the bending diameter of the bending part of the display body 140 is reduced to be the thickness of the second glue layer 1523 and the size of the side frame region of the display body is reduced. Thus, the display effect of the display panel 100 is improved.

Furthermore, through placing the second glue layer 1523 in the first sub-groove 131, the structural stability of the second glue layer 1523 relative to the second back plate 120 could be raised. This could avoid that the second glue layer 1523 moves relatively to the second back plate 120 when the display panel 100 is being used. Thus, the structural stability of the buffer support structure 150 relative to the second back plate 120 is raised and the structural stability of the entire display panel 100 is raised.

In another embodiment, the second glue layer 1523 and the wave absorption layer 1522 are both placed in the first sub-groove 131. That is, the distance between the first back plate 110 and the second back plate 120 is equal to the sum of the thicknesses of the buffer layer 151 and the first glue layer 1521. This reduces the bending diameter of the bend-ing part 143 of the display body 140 to be the sum of the thicknesses of the second glue layer 1523 and the wave absorption layer 1522. Thus, the bending radius of the bending part 143 of the display body 140 is reduced and the size of the side frame of the display body 140 is also reduced such that the display effect of the display panel 100 is improved. Furthermore, the structural stability of the buffer support structure 150 relative to the second back plate 120 is also improved.

By keeping the first glue layer of the supporting layer 152 outside the first sub-groove 131, it is easier for the first glue layer 1521 to connect the buffer layer 151 to the supporting layer 152. This ensures the connection effect between the buffer layer 151 and the supporting layer 152 and raises the relative stability of the first back plate 110 and the second back plate 120.

Figure 2:
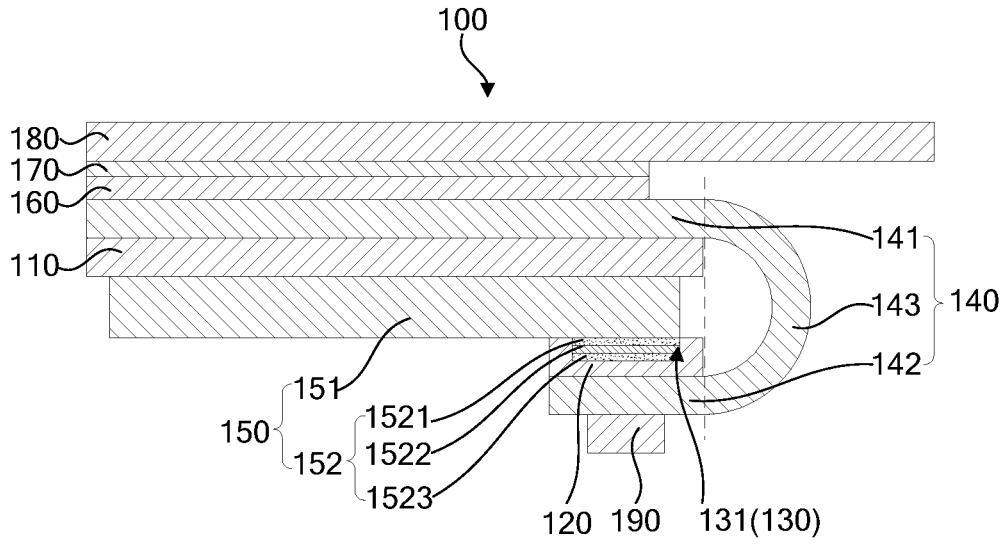
FIG. 2 is a diagram of a display panel according to another embodiment of the present disclosure.

As shown in FIG. 2, the supporting layer 152 is wholly placed in the first sub-groove 131. That is, the buffer layer 151 directly contacts the side of the second back plate 120 facing the first back plate 110. This makes the distance between the first back plate 110 and the second back plate 120 equal to the thickness of the buffer layer 151 and could reduce the bending radius of the bending part 143 of the display body 140. This could further reduce the side of the side frame region of the display body 140 and raise the display effect of the display panel 100.

When the supporting layer 152 is wholly placed in the first sub-groove 131, the first glue layer 1521 of the supporting layer 152 needs to sufficiently contact the buffer layer 151 to ensure the buffer layer 151 and the supporting layer 152 are effectively connected. This could avoid breaking the connection between the buffer layer 151 and the supporting layer 152 when the display body 140 is being bended. Similarly, this could also avoid the bending part 143 of the display body 140 rebounding when the display body 140 is being bended and thus the bending radius of the bending part 143 of the display body 140 will not change and the structural stability and the display effect of the display body will not be affected.

In order to ensure that the bending radius of the bending part 143 of the display body 140 could be adjusted according to the actual demands. The thickness of the second back plate 120 could be designed as being greater than a thickness of the supporting layer 152. In this way, when the first sub-groove 131 is formed at one side of the second back plate 120 facing the supporting layer 152, the supporting layer 152 could be partially or wholly placed in the first sub-groove 131 to raise the structural stability of the buffer support structure 150 relative to the second back plate 120. This also ensures that the bottom of the first sub-groove 131 has an enough thickness to maintain the structural stability of the second back plate 120.

The sum of the bending radius of the bending part 143 of the display body 140 and the thicknesses of the first back plate 110 and the second back plate 120 is directly related to the distance between the first back plate 110 and the second back plate 120. In an embodiment, the thickness of the second back plate 120 is designed as being greater than the thickness of the supporting layer 152 for placing the supporting layer 152 in the first sub-groove 131 of the second back plate 120 to reduce the distance between the second back plate 120 and the first back plate 110.

In this case, although the thickness of the back plate 120 may be increased, the distance between the second back plate 120 and the first back plate 110 is reduced. By adjusting these two parameters, the bending radius of the bending part 143 of the display body 140 could still be reduced.

Even if the increasing amount of the thickness of the back plate 120 is equal to the reduction amount of the distance between the second back plate 120 and the first back plate 110 such that the bending radius of the bending part 143 of the display body 140 does not change, this structure design could still improve the structural stability of the supporting layer 152 relative to the second back plate. This improves the structural stability of the entire display panel 100.

Figures 3, 4, 5:
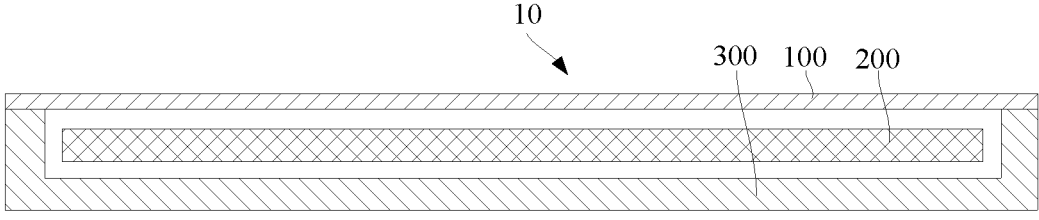
FIG. 3 is a diagram of a display panel according to another embodiment of the present disclosure.
FIG. 4 is a diagram of a display panel according to another embodiment of the present disclosure.
FIG. 5 is a diagram of a display device according to an embodiment of the present disclosure.

As shown in FIG. 4, a second sub-groove 132 is placed at one side of the first back plate 110 facing the buffer layer 151. The buffer layer 151 is partially placed in the second sub-groove 132. This structure design could further reduce the distance between the first back plate 110 and the second back plate 120 and thus reduce the bending radius of the bending part 143 of the display body 140. Accordingly, this could reduce the size of the side frame region of the display panel body 140 and improve the display effect of the display body 140.

The second sub-groove 132 and the first sub-groove 131 are oppositely placed. Because the supporting layer 152 is partially placed in the first sub-groove 131 and the buffer layer 151 is partially placed in the second sub-groove 132, by oppositely placing the second sub-groove 132 and the first sub-groove 131, the part of the supporting layer 152 corresponding to the groove 130 and the part of the buffer layer 151 corresponding to the groove 130 become oppositely placed. This could assist in the position design and the effective connection of the buffer layer 151 and the supporting layer 152 and also raise the relative stability of the display body 140.

In the actual implementation, the bonding part 142 of the display body 140 is mainly used to connect the circuit board 190. The area of the bonding part 142 is smaller than the area of the display part 141. The second back plate 120 is placed at one side of the bonding part 142 facing the display part and could support the bonding part 142. The first back plate 110 is placed at one side of the display part 141 facing the bonding part 142 and could support the display part 141. That is, the area of the second back plate 120 is corresponding to the area of the bonding part 142. The area of the first back plate 110 is corresponding to the area of the display part 141. Therefore, the area of the second back plate 120 is smaller than the area of the first back plate 110.

In this embodiment, the supporting layer 152 is placed at one side of the second back plate 120 facing the first back plate 110 and the buffer layer 151 is placed at one side of the first back plate 110 facing the second back plate 120. That is, the area of the supporting layer 152 is corresponding to the area of the second back plate 120. The area of the buffer layer 151 is corresponding to the area of the first back plate 110. In this way, the area of the supporting layer 152 is smaller than the area of the buffer layer 151.

When the second sub-groove 132 and the first sub-groove 131 are oppositely positioned, the orthogonal projection of the second sub-groove 132 on the buffer layer 151 covers the orthogonal projection of the first sub-groove 131 on the buffer layer 151. That is, the orthogonal projection of the first sub-groove 131 on the buffer layer 151 is a part of the orthogonal projection of the second sub-groove 132 on the buffer layer 151. This design allows the buffer layer 151 to completely cover the supporting layer 152 such that the contact area of the supporting layer 152 and the buffer layer 151 becomes its maximum. This could improve connection effect between the buffer layer 151 and the supporting layer 142 and raise the relative stability of the first back plate 110 and the second back plate 120.

As shown in FIG. 3, the first sub-groove 131 extends along a direction of the bending part 143 and passes through a side surface of the second back plate 120 facing away the bending part 143. That is, there is an opening 135 at one side of the first sub-groove 131 facing away the bending part 143. When the supporting layer 152 is wholly placed in the first sub-groove 131, an opening 135 is formed at one side of the first sub-groove 131 facing away the bending part 143. This allows the buffer layer 151 to be further closer to the supporting layer 152 such that the buffer layer 151 could sufficiently contacts the first glue layer 1521 of the support- ing layer 152. Accordingly, the connection effect of the buffer layer 151 and the supporting layer 152 could be raised.

In one embodiment, the buffer layer 151 is partially placed in the first sub-groove 131. Because the supporting layer 152 is connected between the buffer layer 151 and the second back plate 120, when the buffer layer 151 is partially placed in the first sub-groove 131 of the second back plate 120, it means that the depth of the first sub-groove 131 is greater than the depth of the supporting layer 152 and the supporting layer 152 is wholly placed in the first sub-groove 131 of the second back plate 120 to ensure the effective connection between the supporting layer 152 and the buffer layer 151/the second back plate 120. This structural design could reduce the distance between the first back plate 110 and the second back plate 120 while ensuring sufficient contact between the buffer layer 151 and the supporting layer 152. Therefore, this could reduce the bending radius of the bending part 143 of the display body, reduce the size of the side frame region of the display body 140 and improves the display effect of the display panel 100.

In another embodiment, a part of the buffer layer 151 is placed in the first sub-groove 131 and another part of the buffer layer 151 is placed in the second sub-groove 132. The supporting layer 152 is wholly placed in the first sub-groove 131. Or, the buffer layer 151 is wholly placed in the second sub-groove 132. The supporting layer 152 is wholly placed in the first sub-groove 131. At this time, the buffer layer 151 and the supporting layer 152 are wholly placed in the groove on the first back plate 110 and the second back plate 120. That is, the first back plate 110 directly contacts the second back plate 120 such that the bending radius of the bending part 143 of the display body 140 is related to only the thicknesses of the first back plate 110 and the second back plate 120. This design could maximize the reduction of the bending radius of the bending part 143 of the display body and reduce the size of the side frame of the display body 140.

In another embodiment, there is no second sub-groove 132 at one side of the first back plate 110 facing the buffer layer 151. The buffer layer 151 is merely partially placed in the first sub-groove 131. That is, the supporting layer 152 is wholly placed in the sub-groove 131. At the same time, the buffer layer 151 is partially placed in the first sub-groove 131. This design could ensure the structural entirety of the first back plate 110 and prevent the move of opening a groove on the first back plate 110 from affecting the display effect of the display part 141 while ensuring the effective connection of the buffer layer 151 and the supporting layer 152 and reducing the bending radius of the bending part 143 of the display body 140.

As shown in FIG. 4, the supporting layer 152 and the sidewall of the first sub-groove 131 have a first gap 133 in between. That is, after the supporting layer 152 and the bottom of the first sub-groove 131 are connected via the second glue layer 1523, there is a buffering space between the supporting layer 152 and the sidewall of the first sub- groove 131. When the display body 140 is bended from the first back plate 110 to the second back plate 120, a stress exists in the bending part 143 of the display body 140 and a rebounding force that could rebound the bonding part 142 from the second back plate 120 to the first back plate 110 exists. By placing the first gap 133 between the supporting layer 152 and the sidewall of the first sub-groove 131, when the rebounding force of the bonding part 142 is applied to the second back plate 120, it could avoid the second back plate 120 pressing the supporting layer 152 and thus alle- viate the stress of the bending part 143 of the display body 140.

In some embodiments, the buffer layer 151 and the sidewall of the second sub-groove 132 have a second gap 134 in-between. That is, after the buffer layer 151 and the bottom of the second sub-groove 132 are connected, there is a buffering space between the buffer layer 151 and the sidewall of the second sub-groove 132. When the display body 140 is bended from the first back plate 110 to the second back plate 120, a stress exists in the bending part 143 of the display body 140. Furthermore, because the display part 141 is connected to the bending part 143, an applied force exists in the bending part 143 of the display body 140. The display part 141 is connected to the bending part 143. Thus, the applied force also exists in the display part 11. By placing the second gap 134 between the buffer layer 151 and the sidewall of the second sub-groove 132, when the applied force of the display part 141 is applied to the first back plate 110, it could avoid the first back plate 110 pressing the buffer layer 151 and thus alleviate the stress of the bending part 143 of the display body 140.

In some embodiments, the supporting layer 152 and the sidewall of the first sub-groove 131 have a first gap 133 in between. Furthermore, the buffer layer 151 and the sidewall of the second sub-groove 132 have a second gap 134 in-between. When the display body 140 is bended from the first back plate 110 to the second back plate 120, a stress generated by the bending part 143 of the display body 140 is applied to the display part 141 and the bonding part 142 of the display body 140 and then applied to the first back plate 110 through the display part 141 and applied to the second back plate 120 through the bonding part 142. This design could prevent the first back plate 110 from pressing the buffer layer 151 and prevent the second back plate 120 from pressing the supporting layer 152. Thus, it could alleviate the stress of the bending part 143 of the display body 140 and ensure the entire stability of the display body 140.

The sizes of the first gap 133 and the second gap 134 could be determined according to the stress generated by the bending part 143 of the display body 140 during the actual implementation process. For example, the sizes of the first gap 133 and the second gap 134 could be determined as long as there are enough buffering spaces between the first back plate 110 and the buffer layer 151 and between the second back plate 120 and the supporting layer 152 when the stress of the bending part 143 is applied to the display part 141 and the bonding part 142 and then applied to the first back plate 110 through the display part 141 and applied to the second back plate 120 through the bonding part 142.

The second gap 134 between the buffer layer 151 and the sidewall of the second sub-groove 132 is smaller than or equal to the first gap between the supporting layer 152 and the sidewall of the first sub-groove 131. Since the buffer layer 151 is compressible, when the buffer layer 151 and the sidewall of the second sub-groove 132 press each other, the buffer layer 151 is compressed to alleviate the pressing force between the buffer layer 151 and the second sub-groove 132. By setting the second gap 134 be smaller than or equal to the first gap 133, the area of the second sub-groove 132 on the first back plate 110 could be reduced. This could further ensure the structural stability of the first back plate 110 and improve the entire structural stability of the display panel 100.

Optionally, the bending diameter of the bending part 143 of the display body 140 is smaller than the sum of the thickness of the first back plate 110, the thickness of the second back plate 120 and the thickness of the buffer support structure 150 and is greater than or equal to a sum of the thickness of the first back plate 110 and the thickness of the second back plate 120. That is, the bending part 143 of the display body 140 is in a shape of a half circle. The diameter of the bending part 143 is equal to the sum of the distance between the first back plate 110 and the second back plate 120 and the thicknesses of the first back plate 110 and the second back plate 120.

Because a groove is formed on one side of at least one of the first back plate 110 and the second back plate 120 facing the buffer support structure 150, the distance between the first back plate 110 and the second back plate 120 is smaller than the thickness of the buffer support structure 150. Therefore, the bending diameter of the bending part 143 of the display body 140 is smaller than the sum of thicknesses of the first back plate 110, the second back plate 120 and the buffer support structure 150. When the buffer support structure 150 is wholly placed in the groove 130 on the first back plate 110 and the second back plate 120, the first back plate 110 directly contacts the second back plate 120. In other words, the distance between the first back plate 110 and the second back plate 120 is zero. Therefore, the bending diameter of the bending part 143 of the display body 140 is greater than or equal to the sum of the thicknesses of the first back plate 110 and the second back plate 120.

The bending part 143 of the display body 140 could be in a shape of circle. Because the bending part 143 and its two ends of the display pane body 140 are at the same level with the first back plate 110 and the second back plate 120 but the bending part 143 and the buffer support structure 150 have a gap in between, in the actual implementation, by increasing the driving force to bend the display body 140, the gap between the bending part 143 of the display body 140 and the buffer support structure 150 could be further compressed. This could further reduce the side frame region of the display body and improves the display effect of the display body 140.

Optionally, the display panel 100 further comprises a polarizer 160. The polarizer 160 is placed on one side of the display part 141 of the display body 140 facing away the first back plate 110. That is, the polarizer 160 is pasted on the light output side of the display body 140. By pasting the polarizer 160 on the display part 141 of the display body 140, the contrast of the screen of the display body 140 could be raised and the view angle of the display part 141 of the display body 140 could be enlarged. Thus, the display effect of the display panel 100 is improved.

The display panel 100 further comprises a cover plate 180. The cover plate 180 is placed on the light output side of the display body 140 and covers the entire display body 140 to protect the display body 140 and prevent the external moisture or oxygen from entering the display panel 140 such that the display body 140 could normally work. Because the cover plate 180 is placed at the light output side of the display body 140, in the actual implementation, the cover plate 180 is manufactured with a material of a higher transparency, such as a glass material, such that more light could pass through the cover plate 180 while the cover plate 180 protects the display body 140. This further ensures the display effect of the display panel 100.

The cover plate 180 is pasted on the polarizer 160 through the optical adhesive layer 170 placed on the polarizer 160. Here, the optical adhesive layer 170 also has a higher transparency to prevent from influencing the light passing rate of the display body 140 while ensuring the adhesive stability of the cover plate 180 and the polarizer 160. This further ensures the display effect of the display panel 100.

According to an embodiment of the present disclosure, a display device is disclosed. The display device comprises a display panel. The display panel could be referred to the above-mentioned embodiments. Because the display device adopts the technical features of the above-mentioned embodiments and have the corresponding benefits, further illustrations are omitted here for simplicity.

As shown in FIG. 5, the display device 10 comprises a display panel 100, a control circuit 200 and a housing 300. The housing 300 is connected to the display panel 100 to support and fix the display panel 100. The control circuit 200 is placed inside the housing 300 and is electrically connected to the display panel 100 for controlling the display panel 100 to display an image.

The display panel 100 could be fixed on the housing 300 to form a whole with the housing 300. The display panel 100 and the housing 300 form a closed space for placing the control circuit 200. The control circuit 200 could be the main board of the display device 10. Furthermore, the control circuit 200 could integrate one or more of a battery, an antenna structure, an ambient light sensor, a receiver and a processor such that the display device 10 could be used in all kinds of applications.

The display device 10 is not limited to the components above. The display device could comprise other components, such as a camera, an antenna structure, a fingerprint unlocking module, etc. to enlarge its applicable ranges. These changes all fall within the scope of the present disclosure.

The display 10 could be used in different applications, such as a TV, a computer, a mobile phone, a foldable/flexible display panel and a wearable device (such as a smart band or a smart watch). These changes all fall within the scope of the present disclosure.

The above embodiments are only the preferred embodiments of the present disclosure and are not therefore limiting the scope of the present disclosure. Any equivalent structure or process change made by using the contents of the present specification and drawings, or directly or indirectly applied in other related technical fields, shall be included in the protection scope of the present disclosure.

What is claimed is:

1. A display panel, comprising:
   a display body, comprising:
      a display part;
      a bonding part, placed oppositely to the display part; and
      a bending part, connected between the display part and the bonding part;
   a first back plate, placed at one side of the display part facing the bonding part;
   a second back plate, placed at one side of the bonding part facing the display part; and
   a buffer support structure, connected to the first back plate and the second back plate;
   wherein
      the buffer support structure comprises a buffer layer and a supporting layer orderly placed from the first back plate toward the second back plate;

a first sub-groove is recessed from a surface of the second back plate facing the supporting layer into inside of the second back plate, to define a first bottom and a first side wall;

a second sub-groove is recessed from a surface of the first back plate facing the buffer layer into inside of the first back plate, to define a second bottom and a second side wall;

a part of the buffer layer close to the first back plate is placed in the second sub-groove, a top surface of the part of the buffer layer is contacted with the second bottom, sides of the part of the buffer layer are surrounded by the second side wall, and a part of the second side wall is positioned between the part of the buffer layer and the bending part; and a part of the supporting layer close to the second back plate is placed in the first sub-groove, a bottom surface of the part of the supporting layer is contacted with the first bottom, sides of the part of the supporting layer are surrounded by the first side wall, and a part of the first side wall is positioned between the part of the supporting layer and the bending part.

2. The display panel of claim 1, wherein the display part comprises a switch control layer and a light emitting layer electrically connected to the switch control layer.

3. The display panel of claim 2, further comprising a circuit board electrically connected to the switch control layer, wherein the bonding part is connected to the circuit board at a side of the display part away from the display part.

4. The display panel of claim 1, wherein the supporting layer comprises a first glue layer, a wave absorption layer and a second glue layer orderly placed from the first back plate toward the second back plate; and wherein the second glue layer is placed in the first sub-groove; or wherein the second glue layer and the wave absorption layer are placed in the first sub-groove.

5. The display panel of claim 4, wherein the first glue layer is adhered to the buffer layer, and the second glue layer is adhered to the second back plate.

6. The display panel of claim 1, wherein the supporting layer is wholly placed in the first sub-groove.

7. The display panel of claim 1, wherein an orthogonal projection of the second sub-groove on the buffer layer covers an orthogonal projection of the first sub-groove on the buffer layer.

8. The display panel of claim 7, wherein the buffer layer covers the supporting layer.

9. The display panel of claim 1, wherein the buffer layer is wholly placed in the second sub-groove.

10. The display panel of claim 1, wherein the first sub-groove extends along a direction of the bending part and passes through the first side wall away from the bending part.

11. The display panel of claim 1, wherein a first gap is defined between the supporting layer and the first side wall; and second gap is defined between the buffer layer and the second side wall.

12. The display panel of claim 11, wherein the second gap is smaller than the first gap.

13. The display panel of claim 1, wherein the buffer layer is made of a conductive foam.

14. The display panel of claim 1, wherein a bending diameter of the bending part of the display body is smaller than a sum of a thickness of the first back plate, a thickness of the second back plate and a thickness of the buffer support structure and is greater than a sum of the thickness of the first back plate and the thickness of the second back plate.

15. The display panel of claim 1, further comprising:

a polarizer, placed at one side of the display part of the display body facing away the first back plate;

an optical adhesive layer, placed above the polarizer; and a cover plate, placed above the optical adhesive layer.

16. A display device, comprising a display panel of claim 1.

17. The display device of claim 16, further comprising:

a housing, connecting the display panel; and a control circuit, disposed within the housing and electrically connected to the display panel.

* * * * *